US010205000B2

(12) United States Patent
Tan et al.

(10) Patent No.: US 10,205,000 B2
(45) Date of Patent: Feb. 12, 2019

(54) SEMICONDUCTOR DEVICE WITH IMPROVED NARROW WIDTH EFFECT AND METHOD OF MAKING THEREOF

(71) Applicant: GLOBALFOUNDRIES Singapore Pte. Ltd., Singapore (SG)

(72) Inventors: Xueming Dexter Tan, Singapore (SG); Kiok Boone Elgin Quek, Singapore (SG); Xinfu Liu, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 3 days.

(21) Appl. No.: 14/981,980

(22) Filed: Dec. 29, 2015

(65) Prior Publication Data

US 2017/0186852 A1    Jun. 29, 2017

(51) Int. Cl.
*H01L 29/66* (2006.01)
*H01L 21/265* (2006.01)
*H01L 29/10* (2006.01)
*H01L 29/167* (2006.01)

(52) U.S. Cl.
CPC .. *H01L 29/66575* (2013.01); *H01L 21/26506* (2013.01); *H01L 21/26513* (2013.01); *H01L 29/105* (2013.01); *H01L 29/6659* (2013.01); *H01L 29/167* (2013.01)

(58) Field of Classification Search
CPC ........... H01L 21/26506; H01L 29/1083; H01L 29/66575; H01L 29/105; H01L 29/6659; H01L 21/26513; H01L 29/167
See application file for complete search history.

(56) References Cited

U.S. PATENT DOCUMENTS

| 5,960,276 | A | 9/1999 | Liaw et al. |
| 6,245,639 | B1 | 6/2001 | Tsai et al. |
| 7,071,515 | B2 | 7/2006 | Sheu et al. |
| 8,748,270 | B1* | 6/2014 | Shifren ............ H01L 29/66659 257/E21.443 |
| 9,299,801 | B1* | 3/2016 | Bakhishev ............ H01L 29/105 |
| 2001/0025998 | A1* | 10/2001 | Tsuchiaki .......... H01L 21/26506 257/402 |

(Continued)

*Primary Examiner* — Victor A Mandala
(74) *Attorney, Agent, or Firm* — Horizon IP Pte Ltd.

(57) ABSTRACT

A device and a method for forming a device are disclosed. The method includes providing a substrate prepared with a device region. A device well having second polarity type dopants is formed in the substrate. A threshold voltage ($V_T$) implant is performed with a desired level of second polarity type dopants into the substrate. The $V_T$ implant forms a $V_T$ adjust region to obtain a desired $V_T$ of a transistor. A co-implantation with diffusion suppression material is performed to form a diffusion suppression (DS) region in the substrate. The DS region reduces or prevents segregation and out-diffusion of the $V_T$ implanted second polarity type dopants. A transistor of a first polarity type having a gate is formed in the device region. First and second diffusion regions are formed adjacent to sidewalls of the gate.

20 Claims, 7 Drawing Sheets

(56) References Cited

U.S. PATENT DOCUMENTS

| | | | |
|---|---|---|---|
| 2003/0008462 A1* | 1/2003 | Horiuchi | H01L 21/823807 438/282 |
| 2006/0068556 A1* | 3/2006 | Noda | H01L 21/2253 438/305 |
| 2009/0011581 A1* | 1/2009 | Weber | H01L 21/26506 438/530 |
| 2011/0309447 A1* | 12/2011 | Arghavani | H01L 21/823412 257/368 |
| 2014/0203364 A1* | 7/2014 | Tsunomura | H01L 29/66742 257/347 |
| 2015/0357330 A1* | 12/2015 | Fujita | H01L 29/66477 257/369 |

* cited by examiner

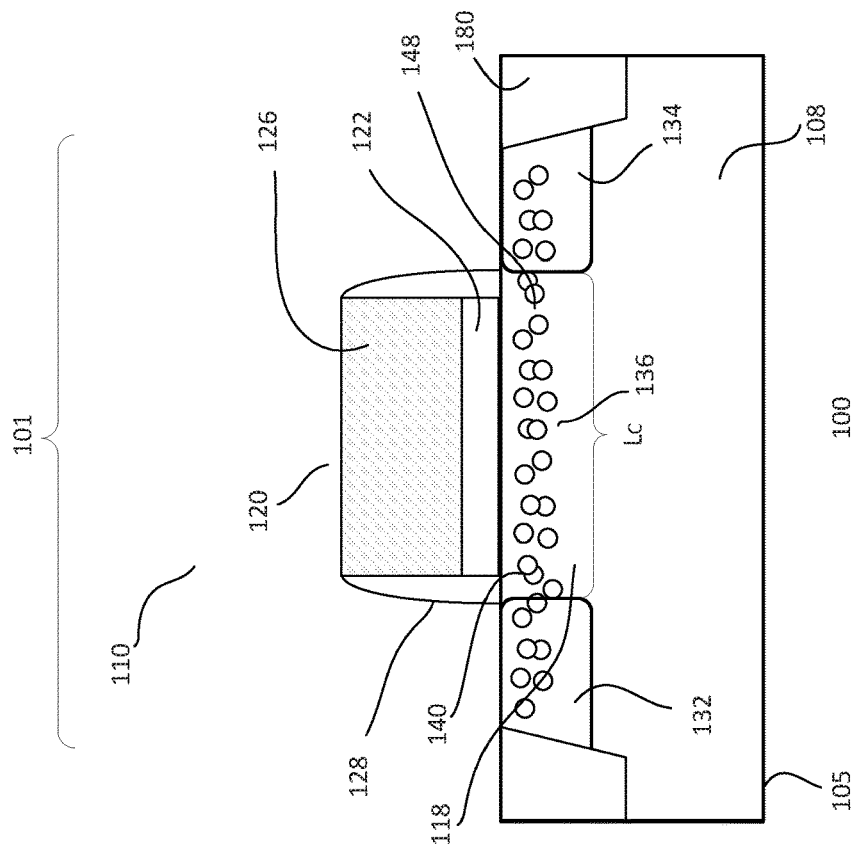
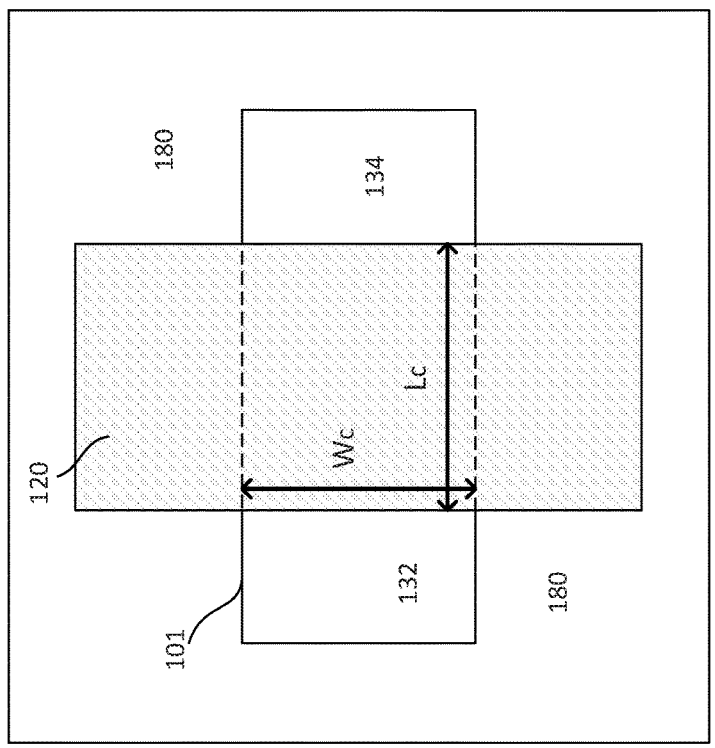
Fig. 1b
Fig. 1a

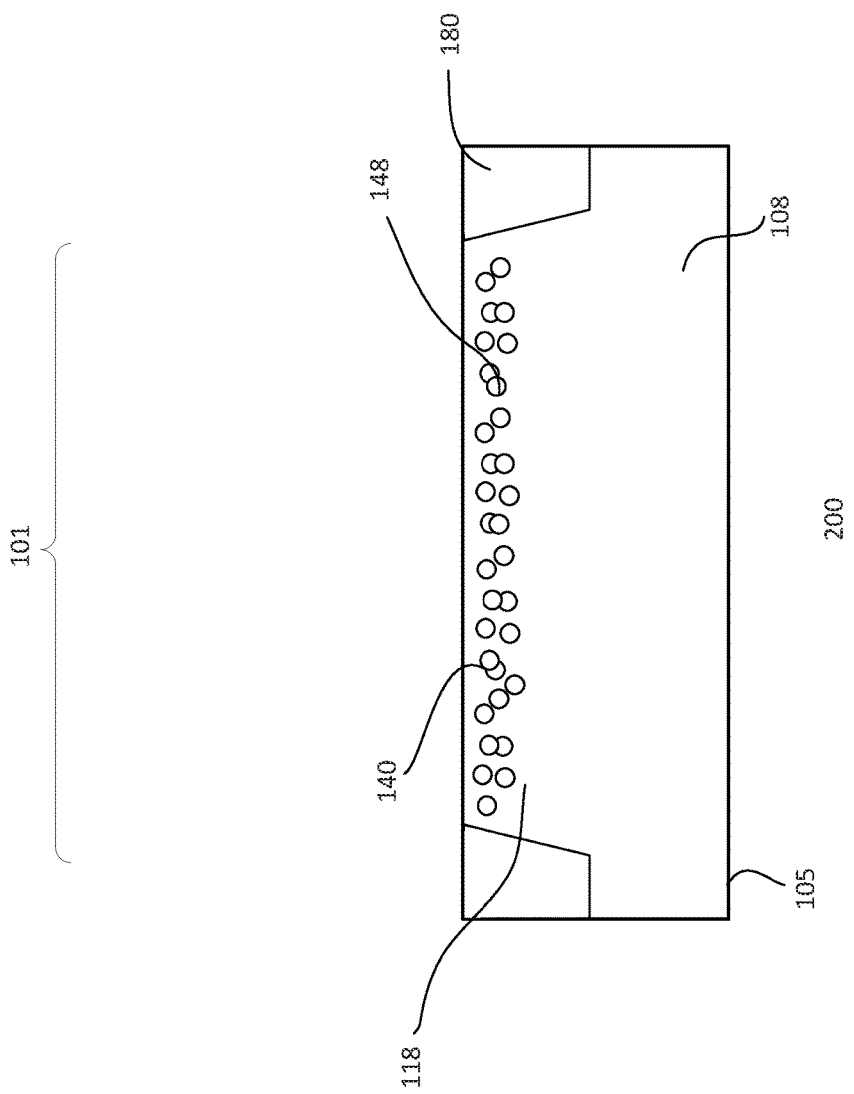

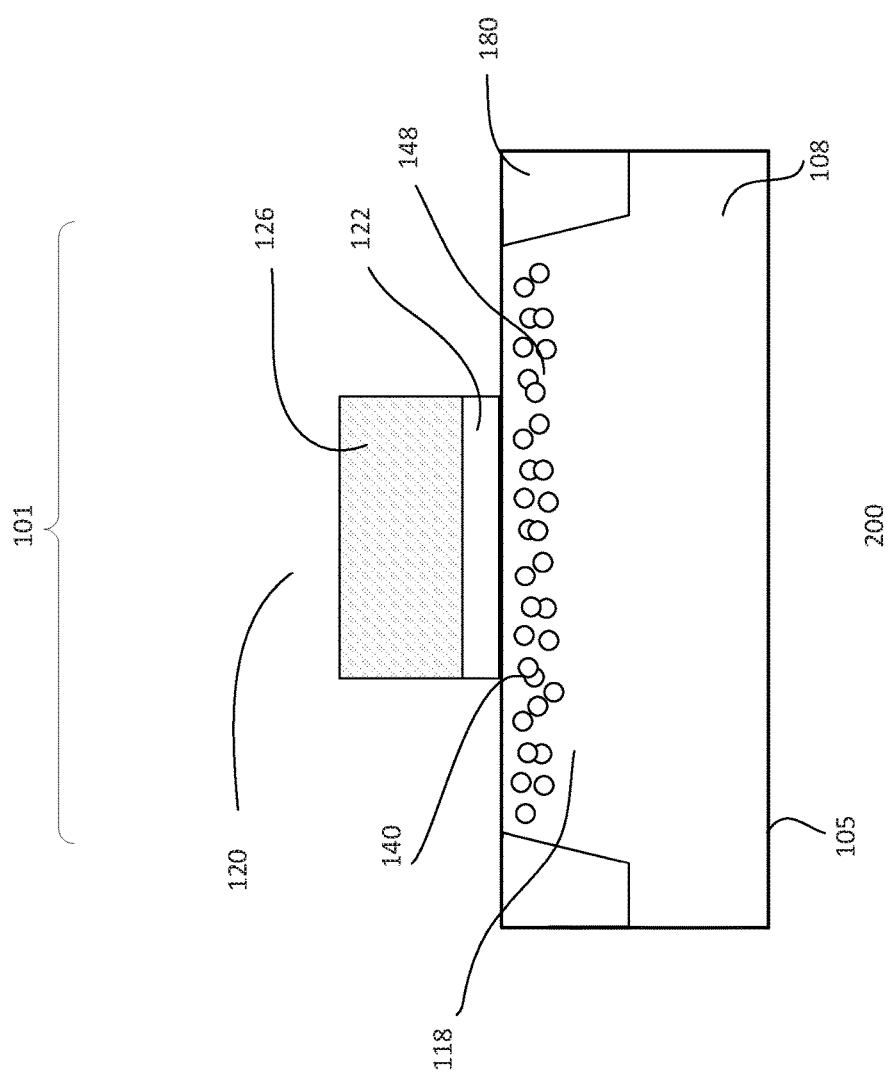

US 10,205,000 B2

SEMICONDUCTOR DEVICE WITH IMPROVED NARROW WIDTH EFFECT AND METHOD OF MAKING THEREOF

BACKGROUND

As semiconductor technology evolve into sub-micron technology nodes, the on-going device scaling results in decreasing of channel length and channel width which may lead to undesirable phenomena, such as narrow width effect (NWE), which causes a shift in threshold voltage ($V_T$). The NWE phenomena entails a depletion of dopants, such as Boron, in the channel region, resulting in lower than designed $V_T$. The depletion of dopants occurs when dopants in the channel region segregate and/or diffuse away from their implanted location during subsequent long thermal cycles. Thus, the NWE undesirably lowers the device $V_T$ and the effect caused by the depletion of dopants is more significant as the width of the channel region decreases. Consequently, performance and reliability of one or more types of devices may degrade. In addition, the anomalous $V_T$ shift for small geometry devices makes device tuning and optimization very challenging.

From the foregoing discussion, it is desirable to provide a reliable, simplified and cost-effective solution to overcome the NWE limitation, such as but not limited to those with long thermal cycle processes.

SUMMARY

Embodiments generally relate to a device and a method for forming a semiconductor device. In one embodiment, a method for forming a device is disclosed. The method includes providing a substrate prepared with a device region. A device well having second polarity type dopants is formed in the substrate. A threshold voltage ($V_T$) implant is performed with a desired level of second polarity type dopants into the substrate. The $V_T$ implant forms a $V_T$ adjust region to obtain a desired $V_T$ of a transistor. A co-implantation with diffusion suppression material is performed to form a diffusion suppression (DS) region in the substrate. The DS region reduces or prevents segregation and out-diffusion of the $V_T$ implanted second polarity type dopants. A transistor of a first polarity type having a gate is formed in the device region. First and second diffusion regions are formed adjacent to sidewalls of the gate.

In another embodiment, a method for forming a high voltage (HV) device is presented. The method includes providing a substrate prepared with a device region. A first implant with second polarity type dopants is performed. The first implant forms a device well in the substrate within the device region. A second implant with the second polarity type dopants is performed. The second implant forms a threshold voltage ($V_T$) adjust region within the device well. The $V_T$ adjust region includes a dopant concentration sufficient to obtain a desired $V_T$ of the HV device. A third implant is performed with diffusion suppression material into the substrate. The third implant forms a diffusion suppression (DS) region which reduces or prevents segregation and out-diffusion of the second polarity type dopants. A HV transistor of a first polarity type is formed. The transistor includes a gate formed over the substrate, and first and second diffusion regions formed within the device well and adjacent to sidewalls of the gate.

In yet another embodiment, a high voltage (HV) device is presented. The device includes a substrate prepared with a device region. A device well having second polarity type dopants is disposed in the substrate within the device region. The device well includes second polarity type dopants. A threshold voltage ($V_T$) adjust region is disposed in a portion of the device well nearer to surface of the substrate. The $V_T$ adjust region comprises a desired level of second polarity type dopants to obtain a desired $V_T$ of the HV device. A diffusion suppression (DS) region is disposed within the device well. The DS region includes diffusion suppression material which reduces or prevents segregation and out-diffusion of the second polarity type dopants. The device includes a HV transistor of a first polarity type having a gate disposed over the substrate in the device region. The HV transistor includes first and second diffusion regions disposed in the substrate adjacent to sidewalls of the gate.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of various embodiments. In the following description, various embodiments of the present disclosure are described with reference to the following, in which:

FIG. 1a shows a simplified top view of an embodiment of a device and FIG. 1b shows a cross-sectional view of the device;

FIGS. 2a-2e show cross-sectional views of an embodiment of a process for forming a device.

DETAILED DESCRIPTION

Figure 2A:
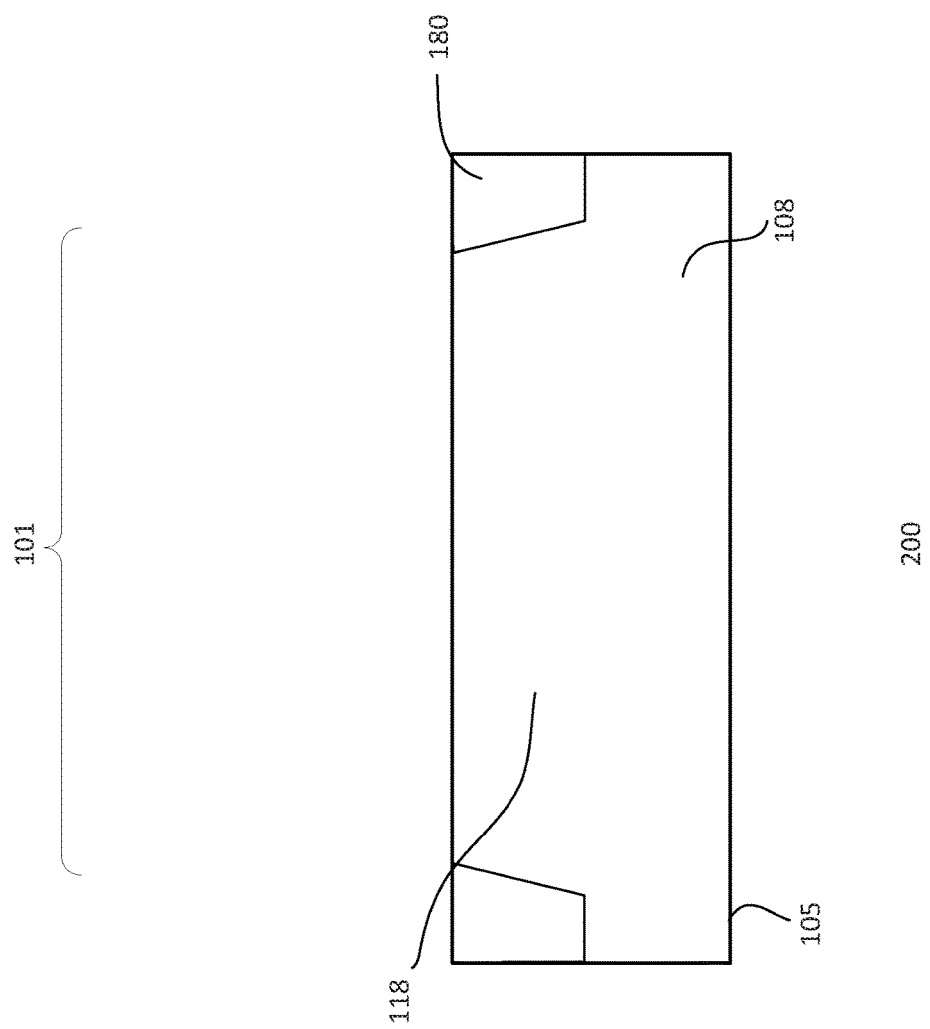

Embodiments generally relate to semiconductor devices or integrated circuits (ICs) and methods for forming semiconductor device. The method or technique as will be described herein is suitable for, for example, semiconductor devices with narrow channel width. The semiconductor devices, for example, may include high voltage (HV) devices. For example, HV devices include HV transistors, such as metal oxide semiconductor (MOS) transistors. In some embodiments, the HV transistors may be formed together with memory devices, including non-volatile memory (NVM) devices. Other types of devices may also be applicable. The devices or ICs can be incorporated into or used with, for example, consumer electronic products, and particularly portable consumer products such as smart phones, mobile phones, tablets, TV displays and personal digital assistants (PDA).

FIG. 1a shows a simplified top view while FIG. 1b shows cross-sectional view of an embodiment of a device 100. The cross-sectional view is taken along a channel length direction of the device. The device, for example, is an IC. Other types of devices may also be useful. As shown, the device includes a substrate 105. The substrate, for example, is a silicon substrate. Other types of substrates, such as silicon germanium, germanium, gallium arsenide, or crystal-oninsulator (COI) such as silicon-on-insulator (SOI), are also useful. The substrate may be a doped substrate. For example, the substrate can be lightly doped with p-type or n-type dopants. P-type dopants may include Boron (B), Fluorine (F), Aluminum (Al), Indium (In) or a combination thereof, while n-type dopants may include Phosphorus (P), Arsenic (As), Antimony (Sb) or a combination thereof. Providing a substrate with other types of dopants or dopant concentrations, as well as an un-doped substrate, may also be useful.

The substrate includes an active device region 101. In one embodiment, the device region is a HV device region suitable for HV transistors. For example, the HV transistors may include a thick gate dielectric and operate in at least 10V regime. The HV transistors may also operate in other suitable voltage ranges depending on design requirements and technology node. The device region may also be configured for other suitable types of devices.

Although one device region is shown, it is understood that the substrate may include various other types of regions (not shown). For example, the substrate may include other device regions for accommodating other types of devices. The IC may include an array region for accommodating one or more memory devices and logic regions in which logic devices are formed. Depending on the type of IC formed, the logic regions, for example, may include regions for different voltage devices. For example, the logic regions may include regions for medium or intermediate voltage (IV) devices and low voltage (LV) devices. Other configurations of logic regions may also be useful. Additionally, other types of device regions may also be provided.

In one embodiment, the active device region is isolated from other regions by an isolation region 180. For example, the isolation region surrounds the device region. The isolation region, for example, is a shallow trench isolation (STI) region. A STI region includes an isolation trench filled with isolation or dielectric materials. Other types of device isolation regions may also be employed. The STI region, for example, extends to a depth of about 3000-5000 Å with respect to the substrate surface. Providing other suitable types of isolation regions and isolation regions having other depth dimensions may also be useful. For simplicity and illustration purpose, the isolation region is shown to have a top surface which is substantially planar with the top surface of the substrate. In other embodiments, the isolation region may have a top surface which extends above the top surface of the substrate.

A device well 108 is provided in the device region. The device well is disposed in the substrate. In one embodiment, the device well is a deep well having a depth deeper than the isolation region. For example, a depth of the device well may be about 3000-10,000 Å. In one embodiment, the device well is doped with second polarity type dopants and serves as a body for a first polarity type transistor. For example, the device well may be doped with p-type dopants for a n-type transistor. This, for example, results in a p-type doped well in the device region. The device well may be lightly or intermediately doped with p-type dopants, such as Boron (B). For example, the dopant concentration of the device well may be about $10^{16}$-$10^{17}$ cm$^{-3}$. Other suitable depth dimensions and dopant concentrations for the device well may also be useful.

In one embodiment, a portion of the device well near to the surface of the substrate may be defined with a threshold voltage ($V_T$) adjust region 118. For example, the depth of the $V_T$ adjust region, for example, may be about 400-500 Å from top surface of the substrate. The $V_T$ adjust region, for example, includes the same polarity type of dopants as the device well. In one embodiment, the $V_T$ adjust region having a depth nearer to the surface of the substrate and the device well having a depth deeper from the surface of the substrate may be formed using the same implant mask but with different implantation energy. The dopant concentration of the dopants in the $V_T$ adjust region may be tailored to obtain a desired $V_T$ as will be described in detail later. The dopant concentration of the dopants in the $V_T$ adjust region, for example, may include about the same dopant concentration as the device well. Other suitable dopant concentration for the $V_T$ adjust region may also be useful. The portion of the device well below the $V_T$ adjust region may serve to isolate the $V_T$ adjust region from the device well.

A first polarity type transistor 110 is disposed in the device region. In one embodiment, the transistor is a metal-oxide-semiconductor field effect transistor (MOSFET). For example, the transistor is a HV transistor. Other suitable types of transistor may also be useful. The transistor includes a gate 120 disposed between first and second diffusion regions 132 and 134. The gate, as shown, includes a gate electrode 126 disposed over a gate dielectric 122 on the substrate. The gate electrode, for example, may be a polysilicon gate electrode. The gate electrode layer may be a doped polysilicon layer. For example, the gate electrode may be doped with first or second polarity type dopants. Doping the gate electrode may depend on the technology. A thickness of the gate electrode may be, for example, about 1000 to 3000 Å. As for the gate dielectric, it can be a silicon oxide layer. Other types of gate electrode or gate dielectric materials, including high-k gate dielectric and metal gate, may also be useful. In one embodiment, the transistor includes a thick gate dielectric. A thickness of the gate dielectric may be, for example, about 10 to 300 Å. The material and thickness of the gate electrode and gate dielectric may vary, depending on technology node and application.

Dielectric spacers 128 may be provided on sidewalls of the gate 120. The dielectric spacers, for example, may include silicon nitride or silicon oxide. Other types of dielectric materials may also be used. In some embodiments, the spacers may include a dielectric stack, such as silicon oxide and silicon nitride.

As shown, the gate 120 is disposed on the substrate while the first and second diffusion regions 132 and 134 are disposed in the substrate. For example, the first and second diffusion regions are disposed adjacent to the sidewalls of the gate. In one embodiment, the first and second diffusion regions are heavily doped with transistor type dopants. For example, the first and second diffusion regions are doped with n-type dopants for a n-type transistor. In one embodiment, the first and second diffusion regions may have a dopant concentration higher than the dopant concentration of the $V_T$ adjust region. The first and second diffusion regions, for example, have a dopant concentration of about $10^{20}$ cm$^{-3}$. Other suitable dopant concentrations and configurations of first and second diffusion regions may also be useful, depending on technology node. The first and second diffusion regions serve as source and drain (S/D) regions of the transistor.

The first and second diffusion regions may optionally be provided with extension diffusion regions (not shown). The extension diffusion regions may be lightly doped shallow regions which extend beneath the spacers. The extension regions may be lightly doped with transistor type dopants. For example, the extension regions serve as lightly doped drain (LDD) regions. Other suitable configurations of extension diffusion regions may also be useful. Providing the extension regions which underlap the gate may increase resistance and have better short channel effect.

The portion of the substrate under the gate and between the first and second diffusion regions 132 and 134 defines a channel region 136 of the transistor. The channel region is, for example, in communication with the first and second diffusion regions. The channel length ($L_C$) is measured along a first direction (e.g., x-direction) connecting the first and second diffusion regions, while the channel width ($W_C$) is measured along a second direction (e.g., y-direction) which is perpendicular to the first direction. Both length and width of the channel lie in a plane, parallel to the device surface. The $L_C$, for example, may be about 1 μm and $W_C$, for example, may be about 0.4 μm. Other suitable dimensions for $L_C$ and $W_C$ may also be useful. In one embodiment, the channel region includes dopants (not shown) of second polarity type opposite to the transistor type. The channel region, for example, includes the same dopant type as the device well and $V_T$ adjust region. For example, the channel region includes p-type dopants, such as Boron, for a n-type transistor. Other configurations of the channel region may also be useful.

The dopant concentration of the dopants, such as Boron, in the channel region under the gate affects the threshold voltage ($V_T$) of the transistor. The $V_T$ of the transistor, for example, determines the requirement for turning the transistor on or off. The $V_T$ is defined as the gate voltage above which the transistor becomes conductive due to an inversion of a thin layer below the gate. This voltage to form the inversion layer is strongly dependent on the dopant concentration of the dopants under the gate in the substrate. However, we found that the dopants in the $V_T$ adjust region, such as Boron, are easily segregated into the isolation region 180 and easily out-diffuse from the surface of the substrate to the atmosphere when subject to thermal processing, such as long thermal cycle processes, resulting in a lower than designed $V_T$. In addition, the segregation and out-diffusion of Boron atoms cause the effective Boron concentration to be even lesser at the corners or edges of the active region, particularly, at the intersection between the isolation region and the first and second diffusion regions. Thus, the corner $V_T$ is lower than that of the central $V_T$. As $W_C$ decreases, the effect of such Boron depletion at the corner regions becomes more significant, leading to larger difference between the corner and central $V_T$ of the transistor. Such $V_T$ difference undesirably creates double hump phenomena which will lead to high drain leakage that negatively affects the reliability and stability of the device.

In one embodiment, the device includes a diffusion suppression (DS) region 148 which reduces or prevents depletion of the dopants, such as Boron, in the substrate under the gate. In one embodiment, the DS region is a shallow region disposed at about a top portion of the substrate. In one embodiment, the diffusion suppression region extends throughout the top portion of the substrate including the first and second diffusion regions and the channel region underlapping the gate. The DS region, for example, has a depth shallower than the depth of the first and second diffusion regions. A depth of the DS region, for example, may be about 200-300 Å from the top surface of the substrate. Other suitable depth dimensions of DS region may also be useful.

In one embodiment, the DS region includes diffusion suppression material 140. The diffusion suppression material, in one embodiment, includes Carbon atoms. The DS region may include a dopant concentration which is about the same or slightly higher than the $V_T$ adjust region but lower than the first and second diffusion regions. The DS region, for example, has a dopant concentration which is about 2-3 orders of magnitude lower than the dopant concentration of the first and second diffusion regions. For example, the DS region includes diffusion suppression material having dopant concentration of about $10^{18}$ cm$^{-3}$. Other suitable concentrations for the diffusion suppression material may also be useful as long as it is sufficient to prevent or reduce segregation and out-diffusion of Boron dopants from the channel region during manufacturing processes and improves narrow width effect.

FIGS. 2a-2e show cross-sectional views of an embodiment of a process 200 for forming a device. The device, for example, is similar to that described in FIGS. 1a-1b. As such, common elements may not be described or described in detail.

Referring to FIG. 2a, a substrate 105 is provided. The substrate, for example, is a semiconductor substrate, such as a silicon substrate. The substrate may be a p-type or n-type doped substrate. For example, the substrate is lightly doped with p-type dopants. Other suitable types of semiconductor substrate, including doped with other types of dopants or concentration or undoped, may also be useful.

The substrate is prepared with one or more isolation regions for isolating the active device region 101 from other regions (not shown). The isolation region 180 is, for example, STI region. Other suitable types of isolation region may also be useful. Various processes can be employed to form the STI region. For example, the substrate can be etched using etch and mask techniques to form trenches which are then filled with a dielectric material, such as silicon oxide. A planarizing process is used to remove excess dielectric material. For example, a chemical mechanical polishing (CMP) can be performed to remove excess dielectric material and provide a planar substrate top surface. Other techniques for forming the STI region may also be useful. The STI region, for example, extends to a depth of about 3000-5000 Å with respect to the substrate surface. Providing other suitable types of isolation regions and isolation regions having other depth dimensions may also be useful. For simplicity and illustration purpose, the isolation region 180 is shown to have a top surface which is substantially planar with the top surface of the substrate. In other embodiments, the isolation region may have a top surface which extends above the top surface of the substrate.

The process continues to form a device well 108 in the substrate. In one embodiment, the device well is implanted with second polarity type dopants and serves as a body for a first polarity type device. For example, the device well may be doped with p-type dopants to form a p-type doped well for a n-type transistor. The device well may be formed by ion implantation. For example, an ion implantation using an implant mask (not shown) which exposes the device region is performed to implant second polarity type dopants. The implant mask, for example, is a photoresist layer patterned by a lithographic mask. The well implantation, for example, may be performed by implanting second polarity type dopants, such as Boron, with suitable implant energy and dose to form a device well having suitable depth and dopant concentration. The device well, for example, includes a depth deeper than the depth of the isolation region. For example, the depth of the device well may be about 3000-10,000 Å with reference to the top surface of the substrate and the dopant concentration of the device well may be about $10^{16}$-$10^{17}$ cm$^{-3}$. As an example, an implant energy of about 200 keV and a dose of about $10^{13}$ cm$^{-2}$ may be used to form a device well having a depth of about 4000 Å from the substrate surface with dopant concentration of about $10^{16}$ cm$^{-3}$. Other suitable implant parameters may also be used for the well implant.

A threshold voltage adjust implant ($V_T$ implant) is performed. The $V_T$ implant, for example, forms a $V_T$ adjust region 118 in the substrate. In one embodiment, the $V_T$ implant is performed using the same implant mask which is used to form the device well. The $V_T$ implant may be performed by placing a desired level of second polarity type dopants, such as p-type dopants, to form the $V_T$ adjust region near the surface of the substrate to obtain the desired threshold voltage ($V_T$). P-type dopants include, for example, Boron or Boron fluoride (BF$_2$). The $V_T$ implant, for example, may be performed with suitable implant energy and dose to form a $V_T$ adjust region having suitable depth and dopant concentration. The $V_T$ implant may be a low energy ion implantation procedure which does not penetrate the isolation region and which forms a $V_T$ adjust region having a depth shallower than the depth of the device well. For example, the depth of the $V_T$ adjust region may be about 400-500 Å with reference to the top surface of the substrate and the dopant concentration of the $V_T$ adjust region may be about $10^{16}$-$10^{17}$ cm$^{-3}$. As an example, an implant energy of about 20 keV and an implant dose of about $10^{13}$ cm$^{-2}$ may be used to form the $V_T$ adjust region having a depth of about 500 Å from the substrate surface with dopant concentration of about $10^{17}$ cm$^{-3}$. Other suitable implant parameters may also be employed for the $V_T$ implant.

In one embodiment, a co-implantation process using diffusion suppression material 140 is performed to reduce or prevent $V_T$ implanted dopants, such as Boron, from segregating into the isolation region or out-diffuse to the atmosphere. In one embodiment, the diffusion suppression material is co-implanted into the substrate using the same implant mask which is used for the well or $V_T$ implant to form a DS region 148 at about a top portion of the substrate as shown in FIG. 2b. The diffusion suppression material, in one embodiment, includes Carbon atoms. Other suitable diffusion suppression material may also be employed. For example, the depth of the DS region may be shallower than the depth of the $V_T$ adjust region which is about 200-300 Å with reference to the top surface of the substrate and the dopant concentration of the DS region may be about the same or slightly higher than the dopant concentration of the $V_T$ adjust region. As an example, diffusion suppression material, such as Carbon atoms, may be implanted using an energy of about 8-10 keV with an implant dose of about $10^{14}$ cm$^{-2}$ to form the DS region having a depth of about 200 Å from the substrate surface with dopant concentration of about $10^{18}$ cm$^{-3}$. Other suitable implant parameters may also be useful as long as the diffusion suppression material is sufficient to prevent or reduce segregation and out-diffusion of Boron dopants from the $V_T$ adjust region including the channel region during manufacturing processes and improves narrow width effect.

The diffusion suppression material, for example, may be implanted after the $V_T$ implant. In other embodiments, it is to be understood that the sequence of performing the $V_T$ implant and Carbon co-implant is interchangeable. For example, performing Carbon implant before $V_T$ implant may also be useful. Other suitable implantation sequences may also be useful.

It is known that certain channel dopant species, such as Boron, tend to segregate from the channel region into the isolation regions and out-diffuse into the atmosphere when the substrate is exposed to thermal treatment such as annealing and other heat treatments. This is undesirable since out-diffusion and/or segregation of channel dopants tends to adversely lower the threshold voltage of the transistor and creates the double hump phenomena, such as that described in FIGS. 1a-1b. We have discovered that Carbon atoms may behave as gathering sites for interstitial defects to reduce dopant segregation. The Carbon atoms may also form a blocking layer to reduce out-diffusion of the Boron atoms. By implanting Carbon atoms into top portion of the substrate, diffusion mechanics of channel dopants, such as Boron, are suppressed. This improves performance of small geometry devices with narrow width effect limitation.

Referring to FIG. 2c, a transistor gate 120 is formed on the substrate. In one embodiment, forming the gate includes forming a gate dielectric layer on the substrate and a gate electrode layer thereon. The gate dielectric layer, for example, is silicon oxide. Other types of gate dielectric layer, such as silicon oxynitride may also be useful. The gate dielectric layer, in one embodiment, is a thick gate dielectric layer suitable for HV application. For example, the gate dielectric layer is sufficiently thick to accommodate a HV device. The thickness of the gate dielectric layer, for example, may be about 10-300 Å. Other suitable gate dielectric thicknesses may also be useful. The gate dielectric layer may be formed by thermal oxidation. For example, the gate dielectric layer is formed by wet oxidation followed by annealing the substrate in an oxidizing ambient. For example, the temperature of the wet oxidation can be about 800° C. and the annealing can be performed at a temperature of about 1000° C. to form a gate dielectric having a thickness of about 200 Å. Forming other types of gate dielectric layer or using other suitable techniques for forming the gate dielectric layer may also be useful.

In one embodiment, the gate electrode layer is a silicon layer. The silicon layer, for example, may be a polysilicon layer. The gate electrode layer may be formed by, for example, chemical vapor deposition (CVD). Other suitable materials and techniques for forming the gate electrode layer may also be useful. The gate electrode layer can be formed as an amorphous or non-amorphous layer. In the case of an amorphous layer, an anneal may be performed to form a polycrystalline silicon layer. Other suitable types of gate dielectric and gate electrode materials or thicknesses may also be useful. For example, the gate dielectric material may be a high k dielectric material while the gate electrode may be a metal gate electrode material. Other configuration of gate layers may also be useful.

The gate layers are patterned to form the transistor gate 120 in the device region. Various techniques, such as mask and etch technique, can be used to form the gate. For example, a photoresist layer is formed over the gate dielectric and gate electrode layers and patterned, exposing portions of the gate layers. An anisotropic etch, such as a reactive ion etch (RIE), is performed to remove exposed portions of the gate layers to form the gate. The gate 120, for example, includes the patterned gate electrode and gate dielectric layers 126 and 122. The gate, for example, may be a gate conductor which serves as a common gate for multiple transistors. Other configurations of the gate may also be useful.

Figure 2D:
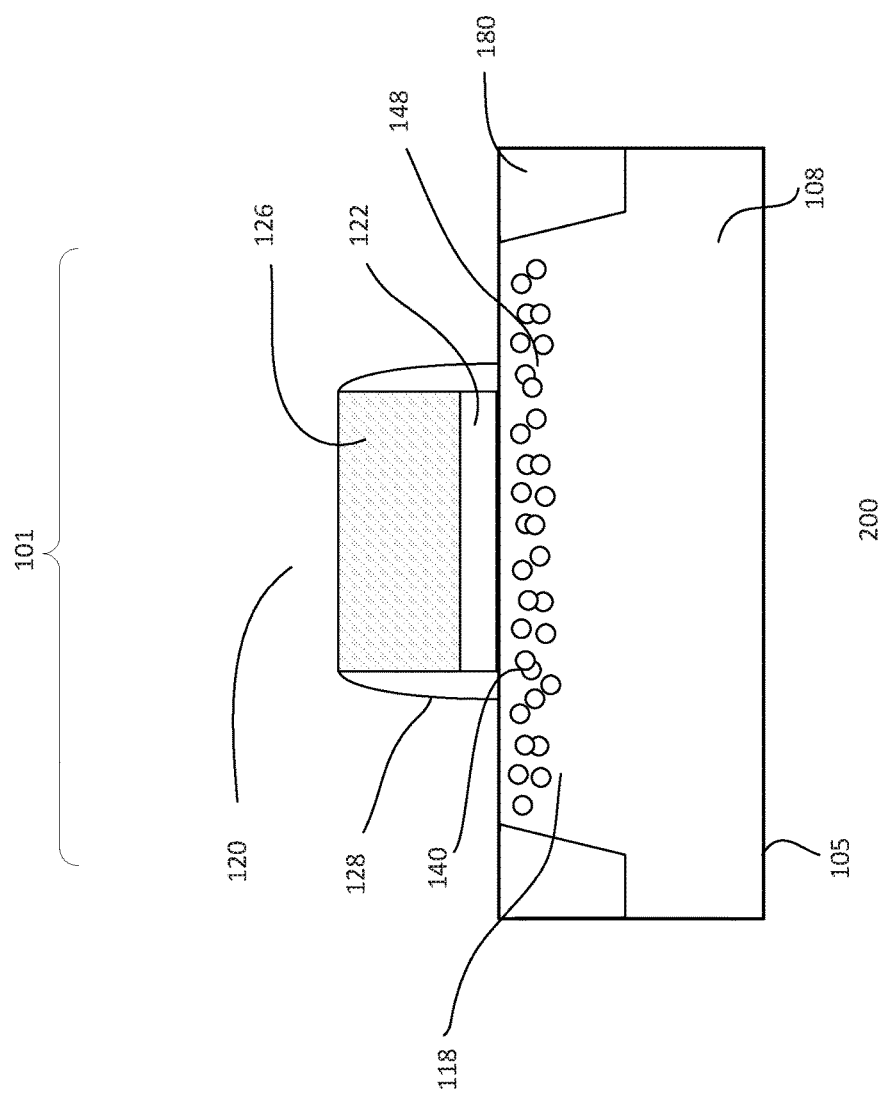

Referring to FIG. 2d, sidewall spacers 128 may be formed on the sidewalls of the gate. To form the sidewall spacers, a dielectric layer is formed on the substrate. The dielectric layer, for example, may be silicon oxide. Other types of dielectric material, such as silicon nitride, may also be used. The dielectric layer may be formed by CVD. The dielectric layer may be formed with suitable thickness and other suitable techniques. The thickness, for example, may depend on the desired width of the spacers. An anisotropic etch, such as RIE, may be performed to remove horizontal portions of the dielectric layer, leaving spacers on the sidewalls of the gate. In some applications, the spacers may be formed from multiple dielectric layers.

Figure 2E:
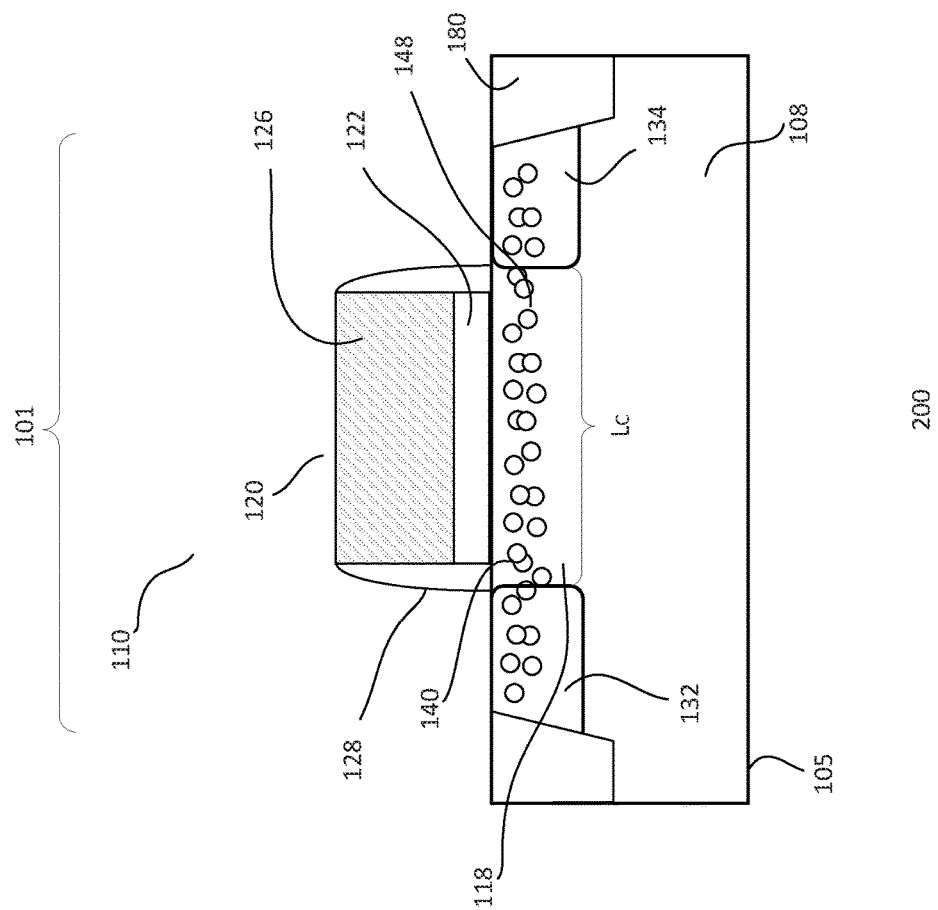

Referring to FIG. 2e, first and second diffusion regions 132 and 134 are formed in the substrate adjacent to the sides of the gate. For example, the first and second diffusion regions are disposed adjacent to sidewalls of the gate and aligned with outer edges of the sidewall spacers. The first and second diffusion regions serve as S/D regions. In one embodiment, the S/D regions are heavily doped regions having transistor type dopants. The first S/D region 132 may be a source region and the second S/D region 134 may be a drain region of the transistor 110. Other configurations of first and second S/D regions may also be useful. For example, the source and drain regions are interchangeable.

Forming the heavily doped regions may be achieved by an implant performed using an implant mask, such as a photoresist mask. The implant mask exposes, for example, the device region. Transistor type dopants are implanted to form the heavily doped S/D regions. The S/D regions are self-aligned to the isolation region 180. The S/D regions may be formed using suitable implant energy and dose to form S/D regions having a depth shallower than the isolation region. Using NMOS as an example, the S/D implant may be performed with an implant dose of about $10^{15}$ cm$^{-2}$ and implant energy of about 30 keV to form S/D regions having a depth of about 800 Å from the top surface of the substrate having dopant concentration of about $10^{20}$ cm$^{-3}$. Other suitable S/D implant parameters may also be used.

After forming the S/D regions, the implant mask is removed. The implant mask may be removed by, for example, ashing. Other techniques for removing the implant mask may also be useful. An anneal, such as rapid thermal anneal (RTA), is performed after the implant to activate the dopants in the S/D regions.

The process may continue to form metal silicide contacts (not shown) on terminals or contact regions of the transistor. For example, the metal silicide contacts are formed on the gate electrode and S/D regions of the transistor. The metal silicide contacts, for example, are nickel based metal silicide contacts. Other types of metal silicide contacts may also be useful. The metal silicide contacts are used to facilitate low resistance contacts between the active substrate and the BEOL metal lines disposed in metal level dielectric layers of the device.

To form metal silicide contacts, a metal layer is deposited on the surface of the substrate. The metal layer, for example, may be nickel or an alloy thereof. Other types of metallic layers, such as cobalt, or alloys thereof, including nickel, may also be used. The metal layer may be formed by physical vapor deposition (PVD). Other processes to form the metal layer may also be useful. An anneal is performed to initiate a reaction between the metal layer and the substrate, forming a silicide layer. For example, the metal layer reacts with the exposed silicon surfaces of the gate electrode and S/D regions, forming silicide contacts. Metal layer disposed over non-silicon material are not reacted. Unreacted metal is removed by, for example, a wet removal process. For example, unreacted metal material is removed selective to the silicide contacts. Other techniques for forming the silicide contacts may also be useful.

The process continues with additional processes to complete the formation of the device. These additional processes may include, for example, forming a pre-metal dielectric (PMD) layer and via contacts to the terminals of the transistor as well as one or more interconnect levels, final passivation, dicing, assembly and packaging. Other processes may also be included.

Figure 3:
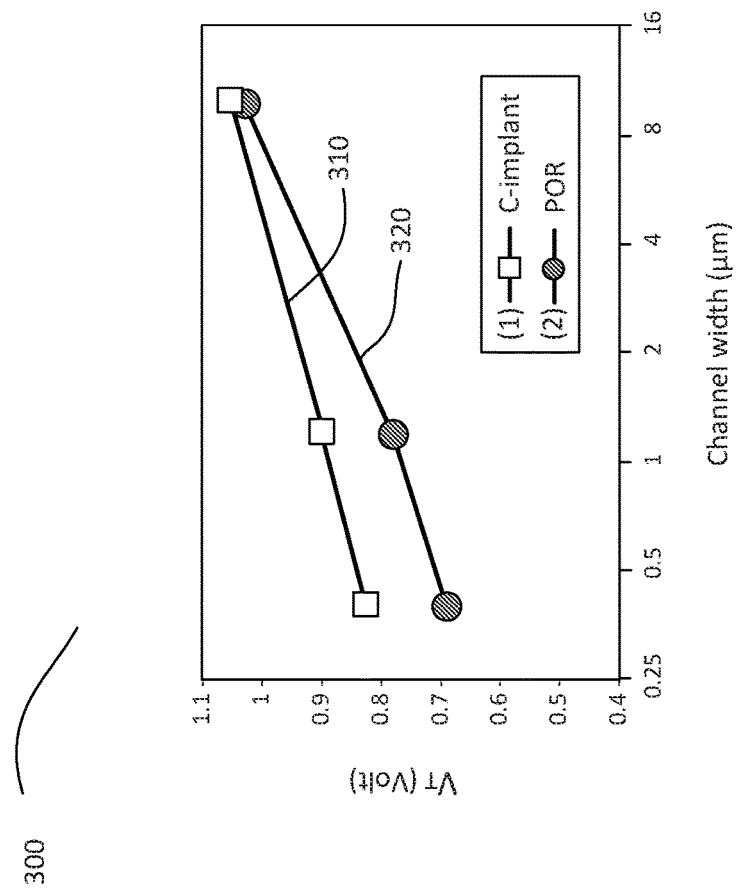
FIG. 3 shows a graph plotting threshold voltage ($V_T$) with respect to channel width of a transistor in accordance with the embodiment as described in FIGS. 1a-1b and a transistor without the provision of a diffusion suppression material.

FIG. 3 shows a graph 300 plotting threshold voltage ($V_T$) with respect to channel width ($W_C$) of a transistor in accordance with the embodiment as described in FIGS. 1a-1b and a transistor without diffusion suppression material, such as Carbon. In the graph, line 310 represents a HV transistor having Carbon material (C) disposed at least within the channel region in accordance to the present disclosure and line 320 represents a HV transistor without diffusion suppression material to prevent or reduce narrow width effect limitation.

As shown, $V_T$ of line 320 decreases rapidly as the channel width is reduced from 10 μm to 0.4 μm. As such, narrow width effect becomes more severe in HV transistors without diffusion suppression material as the channel width is reduced. On the other hand, $V_T$ of line 310 decreases less significantly compared to line 320. Thus, narrow width effect is reduced or better controlled in HV transistors implanted with Carbon material. The improvement in $V_T$ is more pronounced for channel widths less than 1 μm which are more prone to narrow width effect. This is advantageous in improving performance of small geometry devices, such as HV transistors with sub-micron channel widths. In addition, the advantageous effects of Carbon, as shown, may be tuned according to design specifications by modulating Carbon implant dosage. Thus, the embodiment described herein provides a simple and flexibility solution to improve narrow width effect.

The embodiments as described above result in advantages. The embodiments as described employ Carbon co-implantation with $V_T$ implant to reduce narrow width effect. The diffusion suppression material, such as Carbon atoms, effectively minimizes or prevents segregation and out-diffusion of the $V_T$ implanted dopants, such as Boron, even when subject to thermal processing, such as long thermal cycle processes. The process as described with respect to FIGS. 2a-2e is highly compatible with CMOS manufacturing processes and does not require additional masks. Furthermore, using Carbon material does not induce additional charge at silicon interface and provides better positive bias thermal instability (PBTI) parameters in NMOS devices.

The inventive concept of the present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:
1. A method for forming a device comprising:
providing a substrate prepared with a device isolation region, wherein the device isolation region defines a high voltage (HV) device region in the substrate;
performing a first implant to form a device well in the substrate within the HV device region, wherein the device well includes p-type dopants;
performing a second implant to form a threshold voltage ($V_T$) adjust region at a top portion of the substrate in the device well, wherein the $V_T$ adjust region includes p-type dopants;

performing a third implant to form a carbon implant region in the $V_T$ adjust region, wherein the second and the third implants are performed using a same implant mask;

forming a HV (high voltage) transistor gate on the substrate, the HV transistor gate comprising a gate electrode and a gate dielectric layer, wherein the gate dielectric layer is a separate and distinct layer positioned above the carbon implant region;

forming first and second source/drain (S/D) regions within the device well and adjacent to sides of the HV transistor gate, wherein the first and second S/D regions define a transistor channel region disposed within the device well; and wherein the carbon implant region traverses the channel region and the first and second S/D regions, wherein the carbon implant region is adjacent to the device isolation region.

2. The method of claim 1 wherein the device well and the $V_T$ adjust region are defined by Boron dopants.

3. The method of claim 2 wherein the $V_T$ adjust region extends into the channel region.

4. The method of claim 3 wherein the carbon implant region defines a diffusion suppression region which reduces or prevents segregation of Boron dopants into the device isolation region.

5. The method of claim 1 wherein the carbon implant region defines a diffusion suppression region which reduces or prevents segregation of the p-type dopants into the device isolation region.

6. The method of claim 5 wherein the carbon implant region comprises a carbon dopant concentration and the $V_T$ adjust region comprises a p-type dopant concentration, wherein the carbon dopant concentration is same or higher than the p-type dopant concentration.

7. The method of claim 1 wherein the carbon implant region extends from a top surface of the substrate to a depth shallower than the $V_T$ adjust region.

8. The method of claim 1 wherein a co-implantation process is performed to form the $V_T$ adjust region and the carbon implant region.

9. The method of claim 1 wherein the transistor channel region is doped with p-type dopants and carbon.

10. The method of claim 1 wherein the first and second S/D regions extend from a top surface of the substrate to a depth below the $V_T$ adjust region and the carbon implant region.

11. The method of claim 10 wherein the carbon implant region underlaps the gate dielectric layer and extends beyond first and second sides of the gate dielectric layer.

12. A method for forming a high voltage (HV) device comprising:

providing a substrate prepared with a device isolation region, wherein the device isolation region defines a high voltage (HV) device region in the substrate;

performing a first implant to form a device well in the substrate within the HV device region, wherein the device well includes p-type dopants;

performing a second implant to form a threshold voltage ($V_T$) adjust region within the device well, wherein the $V_T$ adjust region includes p-type dopants;

performing a third implant to form a carbon implant region in the $V_T$ adjust region, wherein the second and the third implants are performed using a same implant mask;

forming a HV (high voltage) transistor, wherein the HV transistor comprises a gate disposed on the substrate and first and second source/drain (S/D) regions disposed within the device well, the HV transistor gate comprising a gate electrode and a gate dielectric layer, wherein the gate dielectric layer is a separate and distinct layer positioned above the carbon implant region, wherein the first and second S/D regions define a channel region doped with p-type dopants, wherein the first and second S/D regions include n-type doped regions which extend from a top surface of the substrate to a depth below the $V_T$ adjust region; and wherein the carbon implant region extends laterally through the channel region and into the first and second S/D regions, wherein the carbon implant region is adjacent to the device isolation region.

13. The method of claim 12 wherein the carbon implant region defines a diffusion suppression region which reduces or prevents out-diffusion of the p-type dopants in the $V_T$ adjust region and the channel region.

14. The method of claim 12 wherein the $V_T$ adjust region extends into the channel region.

15. The method of claim 12 wherein the carbon implant region underlaps the gate dielectric layer and extends beyond first and second sides of the gate dielectric layer.

16. The method of claim 12 wherein the device well, the $V_T$ adjust region and the carbon implant region are formed using a same implant mask.

17. The method of claim 12 wherein the carbon implant region extends from the top surface of the substrate to a depth shallower than the $V_T$ adjust region.

18. A method for forming a high voltage device comprising:

providing a substrate prepared with an active device region defined therein;

forming a device well in the active region;

performing a first implant to form a threshold voltage ($V_T$) adjust region in the device well, wherein the $V_T$ adjust region is defined by p-type dopants;

performing a second implant to form a carbon implant region in the $V_T$ adjust region, wherein the first and second implants are performed using a same implant mask;

forming a transistor gate on the substrate, the transistor gate comprising a gate electrode and a gate dielectric layer, wherein the gate dielectric layer is a separate and distinct layer positioned above the carbon implant region;

forming first and second source/drain (S/D) regions adjacent to first and second sides of the transistor gate, wherein the first and second S/D regions define a channel region within the device well; and wherein the carbon implant region underlaps the transistor gate and traverses the channel region, wherein the carbon implant region extends laterally beyond the first and second sides of the transistor gate to traverse the first and second S/D regions.

19. The method of claim 18 wherein the carbon implant region underlaps the gate dielectric layer and extends beyond first and second sides of the gate dielectric layer.

20. The method of claim 19 wherein the carbon implant region defines a diffusion suppression region which reduces or prevents out-diffusion of the p-type dopants in the $V_T$ adjust region.

* * * * *